(12) United States Patent
Dong et al.

(10) Patent No.: US 10,883,679 B2
(45) Date of Patent: Jan. 5, 2021

(54) LAMP

(71) Applicant: BOE TECHNOLOGY GROUP CO., LTD., Beijing (CN)

(72) Inventors: Hang Dong, Beijing (CN); Guowei Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/391,998

(22) Filed: Apr. 23, 2019

(65) Prior Publication Data

US 2020/0032971 A1 Jan. 30, 2020

(30) Foreign Application Priority Data

Jul. 25, 2018 (CN) .......................... 2018 1 0824864

(51) Int. Cl.
| | | |
|---|---|---|
| *F21S 4/22* | (2016.01) | |
| *B60Q 1/26* | (2006.01) | |
| *F21V 17/10* | (2006.01) | |
| *H05K 1/18* | (2006.01) | |
| *F21Y 115/10* | (2016.01) | |

(52) U.S. Cl.
CPC ................. *F21S 4/22* (2016.01); *B60Q 1/26* (2013.01); *F21V 17/10* (2013.01); *H05K 1/189* (2013.01); *F21Y 2115/10* (2016.08); *H05K 2201/10106* (2013.01)

(58) Field of Classification Search
CPC .................................. F21S 4/22; H05K 1/189
See application file for complete search history.

(56) References Cited

U.S. PATENT DOCUMENTS

| | | | |
|---|---|---|---|
| 5,383,099 A | * | 1/1995 | Peters ................... G03B 15/06 362/18 |
| 8,430,530 B2 | | 4/2013 | Aurongzeb et al. |
| 9,506,633 B2 | | 11/2016 | Tischler et al. |
| 2015/0196443 A1 | | 7/2015 | Tarquinio |

FOREIGN PATENT DOCUMENTS

| | | |
|---|---|---|
| CN | 201379103 Y | 1/2010 |
| CN | 102812291 A | 12/2012 |
| CN | 203507355 U | 4/2014 |
| CN | 203549674 U | 4/2014 |

(Continued)

OTHER PUBLICATIONS

First Chinese Office Action dated Jun. 28, 2019.
Second Chinese Office Action dated Jan. 6, 2020.

*Primary Examiner* — Joseph L Williams
*Assistant Examiner* — Jacob R Stern
(74) *Attorney, Agent, or Firm* — Dilworth & Barrese, LLP.; Michael J. Musella, Esq.

(57) ABSTRACT

A lamp is provided and includes: a light-emitting flexible lamp sheet; a movable rod on a first side of the flexible lamp sheet and having a first end connected to a middle part of the flexible lamp sheet; and a plurality of support rods on the first side of the flexible lamp sheet, each of the plurality of support rods having a first end connected to an edge of the flexible lamp sheet, wherein the movable rod and the plurality of support rods are configured to perform relative motion substantially along an extension direction of the movable rod to change a shape of the flexible lamp sheet.

15 Claims, 3 Drawing Sheets

(56) References Cited

FOREIGN PATENT DOCUMENTS

| | | | |
|---|---|---|---|
| CN | 106122866 A | 11/2016 | |
| CN | 107084354 A | 8/2017 | |
| CN | 206739003 U | 12/2017 | |
| WO | WO-2013044799 A1 * | 4/2013 | ............. G03B 15/06 |
| WO | 2014128635 A1 | 8/2014 | |
| WO | 2015113003 A1 | 7/2015 | |

* cited by examiner

LAMP

The application claims priority to the Chinese patent application No. 201810824864.3, filed Jul. 25, 2018, the disclosure of which is incorporated herein by reference as part of the application.

TECHNICAL FIELD

Embodiments of the disclosure relate to a lamp.

BACKGROUND

The conventional vehicle lamps are mainly halogen lamps, xenon lamps, light-emitting diode (LED) lamps and organic light-emitting diode (OLED) lamps. The structures of these lamps are relatively complicated, and the volume is large and the cost is high.

SUMMARY

At least one embodiment of the disclosure provides a lamp comprising: a light-emitting flexible lamp sheet; a movable rod on a first side of the flexible lamp sheet and having a first end connected to a middle part of the flexible lamp sheet; and a plurality of support rods on the first side of the flexible lamp sheet, each of the plurality of support rods having a first end connected to an edge of the flexible lamp sheet, wherein the movable rod and the plurality of support rods are configured to perform relative motion substantially along an extension direction of the movable rod to change a shape of the flexible lamp sheet.

In some examples, the plurality of support rods are sequentially arranged along a circumferential direction of the movable rod.

In some examples, the lamp further comprises a fastener, wherein each of the plurality of support rods has a second end connected to the fastener.

In some examples, the fastener includes a run-through guide hole, and the movable rod runs through the guide hole.

In some examples, the second end of each of the plurality of support rods is hinged with the fastener.

In some examples, the lamp further comprises: a position ring, wherein an insert hole is formed at the second end of each of the plurality of support rods, and the position ring is embedded into the insert hole.

In some examples, an accommodating groove is provided on a side of the fastener facing the flexible lamp sheet, and the second end of each of the plurality of support rods is extended into the accommodating groove.

In some examples, the lamp further comprises a diameter adjusting ring, wherein the edge of the flexible lamp sheet is fixed on the diameter adjusting ring, and the second ends of the plurality of support rods are all connected to the diameter adjusting ring.

In some examples, at least one of the plurality of support rods is provided with a wire hole, and a conductive wire runs through and is mounted in the wire hole and is electrically connected with the flexible lamp sheet.

In some examples, the lamp further comprises: at least one power transmission rod on a side of the fastener away from the flexible lamp sheet and connected with the fastener.

In some examples, the at least one power transmission rod includes a plurality of power transmission rods sequentially arranged along the circumferential direction of the movable rod.

In some examples, the movable rod is substantially perpendicular to a plane in which the diameter adjusting ring is located.

In some examples, the guide hole is a through hole, and the movable rod is movably mounted in the through hole; or the guide hole has an inner wall provided with internal threads, the movable rod is provided with external threads, and the external threads of the movable rod are engaged with the internal threads of the guide hole.

In some examples, the flexible lamp sheet includes a luminous area and a device package area around the luminous area.

In some examples, the flexible lamp sheet includes a luminous surface on a second side of the flexible lamp sheet opposite to the first side.

In some examples, the lamp further comprises a housing, wherein the light-emitting flexible lamp sheet, the movable rod and the plurality of support rods are all disposed in the housing.

In some examples, the lamp is a vehicle lamp.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Hereinafter, some vehicle lamps according to embodiments of the disclosure are described in combination of the drawings.

Figure 2:
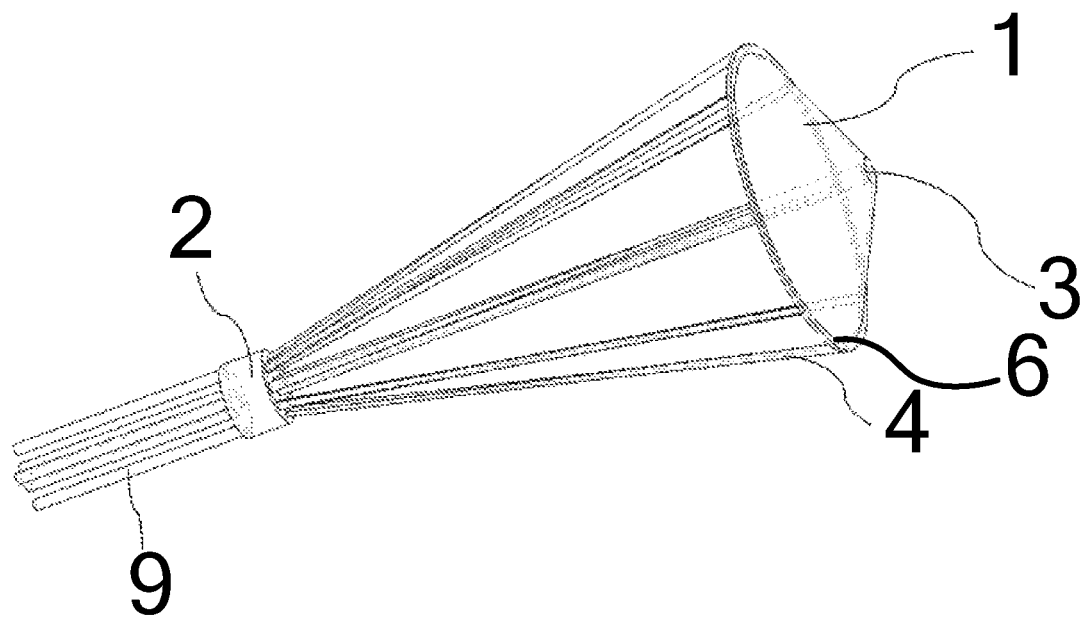
FIG. 2 is a schematic structural perspective view illustrating another use state of the vehicle lamp as illustrated in FIG. 1.
Figure 3:
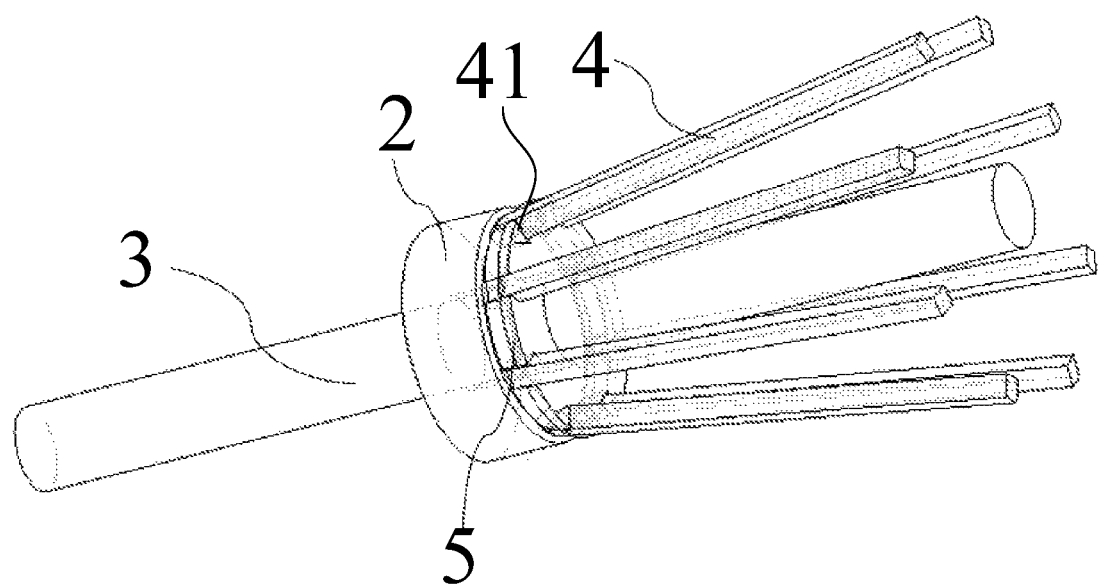
FIG. 3 is a schematic structural perspective view of a vehicle lamp provided by another embodiment of the present invention obtained after the removable of a flexible lamp sheet.
Figure 4:
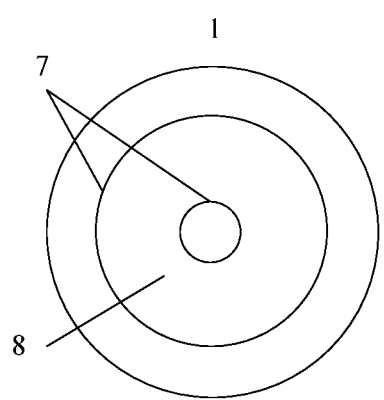
FIG. 4 is a schematic structural view of a flexible lamp sheet as illustrated in FIGS. 1-3.
Figure 5:
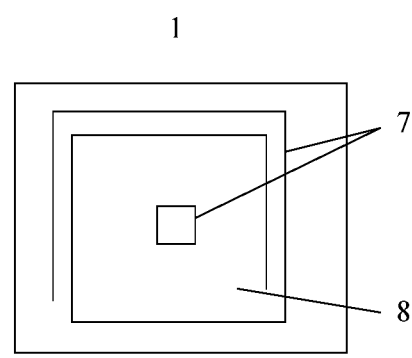
FIG. 5 is a schematic structural view of a flexible lamp provided in another embodiment of the present invention.

As illustrated in FIGS. 1 to 5, the vehicle lamp provided by the present disclosure comprises: a light-emitting flexible lamp sheet 1; a fastener 2 provided with a run-through guide hole; a movable rod 3 movably mounted in the guide hole, in which one end of the movable rod 3 close to the flexible lamp sheet 1 is connected to the middle part of the flexible lamp sheet 1; and a plurality of support rods 4 disposed between the flexible lamp sheet 1 and the fastener 2 and sequentially arranged along the circumferential direction of the movable rod 3, wherein ends of the plurality of support rods 4 close to the flexible lamp sheet 1 are all connected to the edge of the flexible lamp sheet 1, and ends of the plurality of support rods 4 close to the fastener 2 are connected with the fastener 2. For instance, the flexible lamp sheet may be an organic light emitting diode (OLED) flexible lamp sheet. For instance, as illustrated in FIGS. 4 and 5, the flexible lamp sheet may be round or square in shape, but no limitation will be given here in the embodiment of the present disclosure. The flexible lamp sheet may also be in any other appropriate shape.

For instance, the vehicle lamp provided by the embodiment of the present disclosure comprises: a light-emitting flexible lamp sheet; a movable rod which is disposed on a first side of the flexible lamp sheet and of which the first end is connected to the middle part of the flexible lamp sheet; and a plurality of support rods disposed on the first side of the flexible lamp sheet, in which the first end of each support rod is connected to the edge of the flexible lamp sheet. The movable rod and the plurality of support rods are configured to perform relative motion substantially along the extension direction of the movable rod to change the shape of the flexible lamp sheet.

The vehicle lamp changes the concave-convex shape of the flexible lamp sheet 1 by the motion of the movable rod 3 facing the flexible lamp sheet 1 or being away from the flexible lamp sheet 1, so as to dynamically adjust the angle of emitted light and change the emission effect of the light. Compared with a lamp with a plurality of fixing angles, the structure is simpler and more space can be saved.

Figure 1:
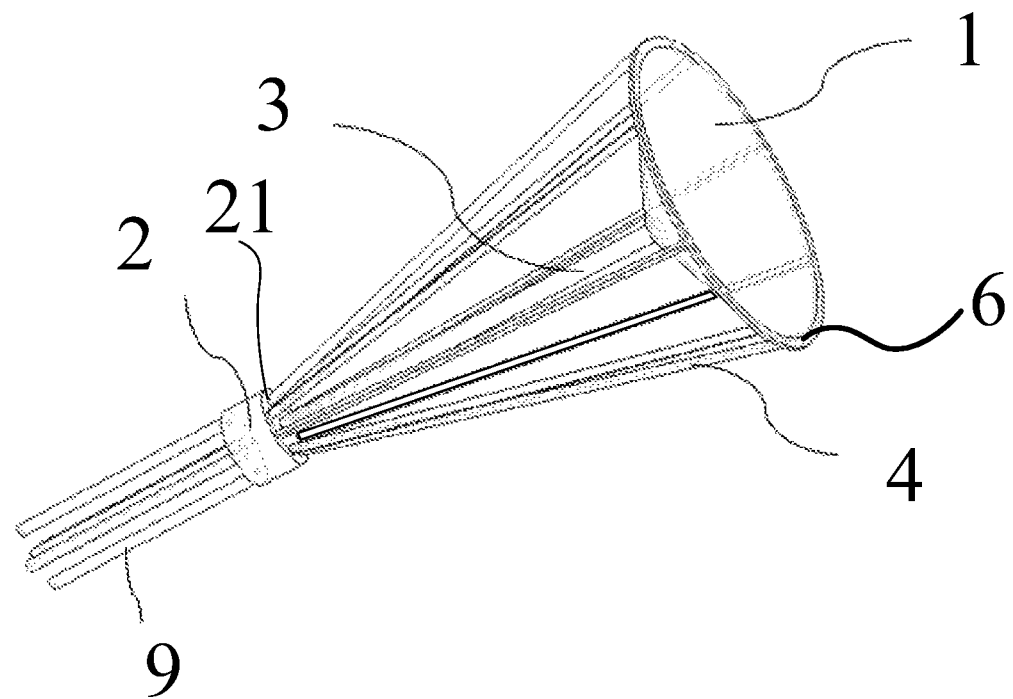
FIG. 1 is a schematic structural perspective view illustrating one use state of a vehicle lamp provided by one embodiment of the present invention.

For instance, as illustrated in FIGS. 1 and 2, the ends of the plurality of support rods 4 close to the fastener 2 are all hinged with the fastener 2.

For instance, as illustrated in FIG. 3, an insert hole 41 is formed at the end of each of the support rod 4s close to the fastener 2. For instance, the insert hole may be an elongated hole. The vehicle lamp further comprises: a position ring 5, wherein the position ring 5 runs through and is mounted in the plurality of insert holes (namely at least one part of the position ring 5 is embedded into the insert hole) and is configured to retain the ends of the plurality of support rods 4 close to the fastener 2, so as to better ensure the shape of the vehicle lamp under various use states. The position ring 5 can adjust the position in the elongated hole under the motion of the movable rod 3, so as to realize the adaptive adjustment of the relative position between the plurality of support rods 4 and the movable rod 3, and then the angle of emitted light can be better adjusted.

As illustrated in FIG. 1, an accommodating groove 21 is formed at one end of the fastener 2 facing the flexible lamp sheet 1, and the ends of the plurality of support rods 4 close to the fastener 2 are extended into the accommodating groove 21, so as to realize the adaptive adjustment of the relative position between the plurality of support rods 4 and the movable rod 3 in the process of adjusting the movable rod 3, and then the angle of emitted light can be better adjusted.

Optionally, as illustrated in FIGS. 1 and 2, the vehicle lamp further comprises: a diameter adjusting ring 6. The edge of the flexible lamp sheet 1 is fixed on the diameter adjusting ring 6, and the ends of the plurality of support rods 4 close to the flexible lamp sheet 1 are all connected (for instance, by means such as welding) to the diameter adjusting ring 6, so that the plurality of support rods 4 can be connected to the edge of the flexible lamp sheet through the diameter adjusting ring. The diameter adjusting ring 6 can be adapted to change the diameter according to the position of the movable rod 3, so as to adapt to the change of the flexible lamp sheet 1. For instance, the diameter adjusting ring is formed by the sequential end-to-end inserting of a plurality of curved ribs, but the embodiment of the present invention is not limited thereto.

For instance, the extension direction (axial direction) of the movable rod 3 is substantially perpendicular to the direction of a plane in which the diameter adjusting ring 6 is located.

For instance, a luminous surface is disposed on an opposite side of the side of the flexible lamp sheet 1 provided with the movable rod and the support rods. The shape of the luminous surface can be changed by adjustment of the relative positional relationship of the movable rod and the support rods, and then the angle of emitted light can be changed.

Optionally, a wire hole is formed in at least one of the plurality of support rods, and a conductive wire runs through and is mounted in the wire hole for connection layout and is electrically connected with the flexible lamp sheet 1.

Optionally, as illustrated in FIGS. 4 and 5, a device package area 7 and an OLED luminous area 8 are disposed on the flexible lamp sheet 1. The device package area 7 can isolate water vapor. In addition, a drive element for driving the OLED to emit light may also be disposed in the device package area. The OLED luminous area 8 is disposed in an area encircled by the device package area 7, and the conductive wire is connected with the flexible lamp sheet 1 by bonding. As illustrated in FIGS. 4 and 5, for instance, the flexible lamp sheet 1 may comprise a first package area disposed in the center and a second package area disposed on the circumference, and the luminous area of the flexible lamp sheet 1 is disposed between the first package area and the second package area. For instance, the movable rod can be connected to the first package area and the support rods can be connected to the second package area.

Optionally, as illustrated in FIGS. 1 and 2, the vehicle lamp further comprises: a power transmission rod 9 disposed on a side of the fastener 2 away from the flexible lamp sheet 1 and connected with the fastener 2. For instance, the vehicle lamp can be adjusted by the following means: fixing the movable rod 3 and manually or mechanically pushing the power transmission rod 9, so that the movable rod can move relative to the support rods, and then the angle of light emitted by the flexible lamp sheet 1 can be adjusted. The number of the power transmission rod may be one and may also be multiple so as to be separately arranged along the circumferential direction of the movable rod 3.

For instance, the guide hole is a through hole; the movable rod 3 is movably mounted in the through hole; the movable rod 3 and the flexible lamp piece 1 may adopt bonding connection and may also adopt rotatable connection by a pin or the like, and the movable rod 3 or the fastener 2 may be driven by a linear driving mechanism.

For instance, the guide hole is a threaded hole, namely internal threads are disposed on an inner wall of the guide hole. External threads are disposed on the movable rod 3, and the movable rod 3 is screwed on the threaded hole. For instance, the internal threads of the guide hole are engaged with the external threads of the movable rod. The movable rod 3 is rotationally connected with the flexible lamp sheet 1 through a pin, and the movable rod 3 or the fastener 2 may be driven to rotate by a stepper motor.

The flexible lamp sheet 1 may be composed of a plurality of sector parts. In the process of forming a concave or convex structure, intersected areas of adjacent sector parts overlap each other.

A housing may also be disposed on the outside of the vehicle lamp, and the front of the housing may adopt a flat or curved colorless or colored lamp shade, and can be shaped according to actual needs.

Although the embodiment of the present invention has been described above by taking the vehicle lamp as an example, the present invention is not limited to the vehicle lamp and may be a lamp of any suitable use. The light-emitting device with adjustable shape provided by the present disclosure can be used in any other suitable scene. In addition, the lamp according to the embodiments of the present disclosure is not only limited to illumination use but also may be applied to decoration or other purposes.

The vehicle lamp provided by the embodiments of the present disclosure changes the concave and convex shape of the flexible lamp sheet by the movement of the movable rod facing the flexible lamp sheet or being away from the flexible lamp sheet, thereby dynamically adjusting the angle of the emitted light and changing the luminous effect of the light. Compared with a lamp with a plurality of fixing angles, the structure is simpler and more space can be saved.

In the description of the present disclosure, the terms "mounted", "mutually connected", "connected", "fixed" and the like should be understood broadly. For example, "connected" may be a fixed connection, a detachable connection, or an integral connection, and may be connected directly or indirectly through an intermediate medium. The specific meanings of the above terms in the present disclosure can be understood by those skilled in the art on a case-by-case basis.

In the description of the present description, the description of the terms "one embodiment", "some embodiments", "specific embodiments" and the like means that the specific characteristics, structures, materials or features described in connection with the embodiments or examples are included in at least one embodiment or example of the present invention. In the present description, the schematic representation of the above terms does not necessarily refer to the same embodiment or example. Moreover, the described specific characteristics, structures, materials or features may be combined in a suitable manner in any one or more embodiments or examples.

The foregoing is merely exemplary embodiments of the invention, but is not used to limit the protection scope of the invention. The protection scope of the invention shall be defined by the attached claims.

The invention claimed is:

1. A lamp, comprising:
   a light-emitting flexible lamp sheet;
   a movable rod on a first side of the flexible lamp sheet and having a first end connected to a middle part of the flexible lamp sheet;
   a plurality of support rods on the first side of the flexible lamp sheet, each of the plurality of support rods having a first end connected to an edge of the flexible lamp sheet;
   a fastener, each of the plurality of support rods having a second end connected to the fastener; and
   at least one power transmission rod on a side of the fastener away from the flexible lamp sheet and connected with the fastener, wherein
   the movable rod and the plurality of support rods are configured to perform relative motion substantially along an extension direction of the movable rod to change a shape of the flexible lamp sheet.

2. The lamp according to claim 1, wherein the plurality of support rods are sequentially arranged along a circumferential direction of the movable rod.

3. The lamp according to claim 1, wherein the fastener includes a run-through guide hole, and the movable rod runs through the guide hole.

4. The lamp according to claim 3, wherein
   the guide hole is a through hole, and the movable rod is movably mounted in the through hole; or
   the guide hole has an inner wall provided with internal threads, the movable rod is provided with external threads, and the external threads of the movable rod are engaged with the internal threads of the guide hole.

5. The lamp according to claim 1, wherein the second end of each of the plurality of support rods is hinged with the fastener.

6. The lamp according to claim 1, further comprising:
   a position ring, wherein an insert hole is formed at the second end of each of the plurality of support rods, and the position ring is embedded into the insert hole.

7. The lamp according to claim 1, wherein an accommodating groove is provided on a side of the fastener facing the flexible lamp sheet, and the second end of each of the plurality of support rods is extended into the accommodating groove.

8. The lamp according to claim 1, further comprising:
   a diameter adjusting ring, wherein the edge of the flexible lamp sheet is fixed on the diameter adjusting ring, and the second ends of the plurality of support rods are all connected to the diameter adjusting ring.

9. The lamp according to claim 8, wherein the movable rod is substantially perpendicular to a plane in which the diameter adjusting ring is located.

10. The lamp according to claim 1, wherein at least one of the plurality of support rods is provided with a wire hole, and a conductive wire runs through and is mounted in the wire hole and is electrically connected with the flexible lamp sheet.

11. The lamp according to claim 1, wherein the at least one power transmission rod includes a plurality of power transmission rods sequentially arranged along the circumferential direction of the movable rod.

12. The lamp according to claim 1, wherein the flexible lamp sheet includes a luminous area and a device package area around the luminous area.

13. The lamp according to claim 1, wherein the flexible lamp sheet includes a luminous surface on a second side of the flexible lamp sheet opposite to the first side.

14. The lamp according to claim 1, further comprising a housing, wherein the light-emitting flexible lamp sheet, the movable rod and the plurality of support rods are all disposed in the housing.

15. The lamp according to claim 1, wherein the lamp is a vehicle lamp.

* * * * *